Aug. 23, 1960 D. E. HUMEZ ET AL 2,950,446

SELF-STARTING TRANSISTOR OSCILLATOR UNIT

Filed May 23, 1955

2 Sheets-Sheet 1

*INVENTORS*
DAVID E. HUMEZ
RICHARD F. MOREY JR
*BY* William J. Flynn
ATTORNEY

INVENTORS
DAVID E. HUMEZ
RICHARD F. MOREY JR.
BY William J. Flynn
ATTORNEY

1

2,950,446

SELF-STARTING TRANSISTOR OSCILLATOR UNIT

David E. Humez, Lexington, and Richard F. Morey, Jr., Abington, Mass., assignors, by mesne assignments, to Clevite Corporation, Cleveland, Ohio, a corporation of Ohio

Filed May 23, 1955, Ser. No. 510,484

13 Claims. (Cl. 331—114)

This invention relates to a transistor oscillator unit.

It is an object of this invention to provide a novel and improved transistor oscillator which is especially well suited for use in a power supply for converting low voltage D.C. to a higher voltage.

It is also an object of the present invention to provide a novel transistor oscillator capable generally of good efficiency under various load conditions, and particularly of improved efficiency under loads less than maximum rated load.

Another object of this invention is to provide a novel transistor oscillator having high maximum efficiency and capable of operating at approximately maximum efficiency over a wide range of loads.

Another object of this invention is to provide a novel transistor oscillator having good voltage regulation.

Another object of this invention is to provide a novel transistor oscillator having provision for positive starting under load.

Further it is an object of this invention to provide a novel transistor oscillator which produces a substantially square wave output.

A further object of this invention is to provide a novel transistor oscillator having provision for easily compensating for variations in transistor parameters.

Still another object of this invention is to provide a novel transistor oscillator which ceases to oscillate when heavily overloaded and which, after removal of the overload, recovers and begins to oscillate again.

These objects preferably are accomplished in the present invention by the provision of an audio frequency square wave oscillator which includes a pair of transistors connected in push-pull relation and having transformer feedback coupling between their respective input and output circuits, along with a resistor and a transistor connected to provide self-starting of the oscillator under load.

Other and further objects and advantages of the present invention will be apparent from the following detailed description of certain preferred embodiments illustrated schematically in the accompanying drawings.

Figure 1:
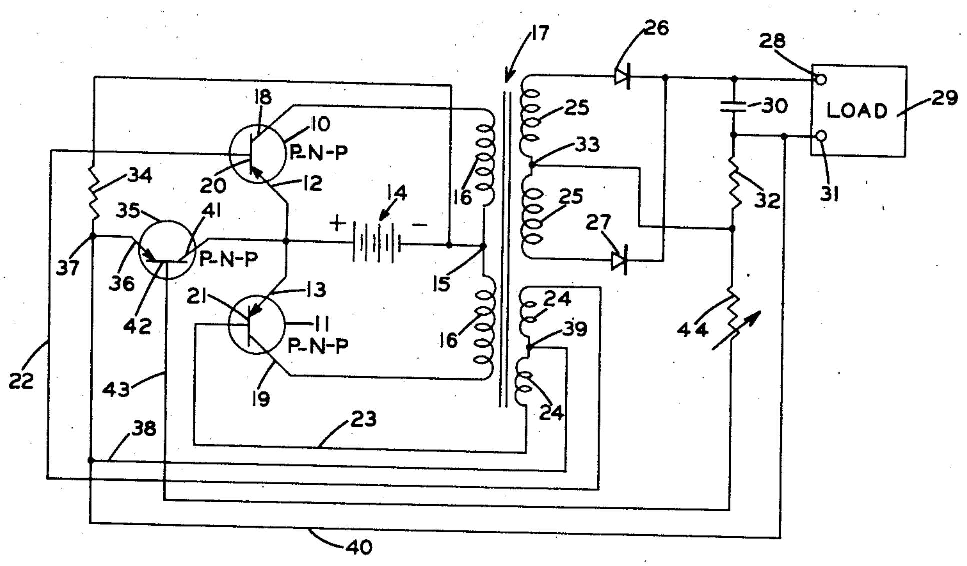
Figure 1 is a circuit diagram of a common-emitter transistor oscillator in accordance with the present invention.

Referring to Fig. 1, the oscillator in accordance with this embodiment of the present invention comprises a pair of P-N-P transistors 10 and 11 connected in push-pull

2 relation. Both emitters 12 and 13 are connected directly to the positive terminal of direct current low voltage source, such as a 6 volt, 12 volt, or 28 volt battery 14. The negative terminal of this battery is connected to the center tap 15 on the primary winding 16 of a transformer 17, which preferably has a core of iron, ferrite or other suitable magnetic material. The opposite ends of this primary winding are connected to the respective collector electrodes 18 and 19 of the transistors 10 and 11. The base electrodes 20 and 21 of the transistors are connected through lines 22 and 23, respectively, to opposite ends of a voltage step-down secondary feedback winding 24 on the core of transformer 17.

Each of the transistors 10 and 11 preferably is of a type able to maintain high gain at emitter currents of the order of amperes. In one desirable embodiment, each of these transistors is a P-N-P alloy junction transistor as disclosed and claimed in the co-pending application of Neville H. Fletcher, Serial No. 477,627, assigned to the same assignee as the present invention. Alternatively, other transistors might be employed. If it is desired to use N-P-N transistors, the bias connections for the emitter and collector electrodes would be reversed from the arrangement shown in Fig. 1.

Each of the transistors in Fig. 1 comprises a semiconductor body contacted by the emitter, base and collector electrodes. The base electrode makes low resistance, ohmic contact with the semiconductor body. The emitter electrode makes rectifier contact with the semiconductor body and is biased by battery 14 for current conduction in the forward or low resistance direction. The collector electrode makes rectifier contact with the semiconductor body and is biased for current conduction in the reverse or high resistance direction.

The transformer core also carries another secondary winding 25 having its opposite ends connected to rectifiers 26, 27, which have their negative terminals connected directly to one terminal 28 of the load 29. A capacitor 30 is connected across the load terminals 28 and 31. A resistor 32 is connected between the load terminal 31 and a center tap 33 on the transformer secondary 25. Secondary winding 25 has a sufficient number of turns to provide the desired voltage step-up for operating the load.

In accordance with the present invention there is provided a novel resistive impedance arrangement insuring positive starting of the oscillator under load. This impedance arrangement comprises a first resistor 34 having one of its terminals connected directly to the negative terminal of battery 14, which is the bias connection for each collector electrode. A second resistive impedance element in the form of a P-N-P transistor 35 is connected between the opposite end of resistor 34 and the positive battery terminal. Transistor 35 has its emitter electrode 36 directly connected at point 37 to the end of resistor 34 remote from the negative battery terminal. Point 37 is directly connected through line 38 to a center tap 39 on the feedback winding 24, and through line 40 to the load terminal 31. The collector electrode 41 of transistor 35 is connected directly to the positive battery terminal. The base electrode 42 of transistor 35 is connected through line 43 and resistor 44 to the center tap 33 on the transformer secondary 25.

Current drawn from the battery by resistor 34 and transistor 35 flows through resistor 34 and then divides among transistor 35 and the input circuits of the push-pull connected transistors 10 and 11. The current flowing in the emitter-base portion of each transistor 10, 11 depends upon the input resistance of that transistor. The voltage induced across the feedback winding 24 of the transformer 17 is essentially a square wave of such polarity that it forward-biases the emitter-base diode of the transistor 10 or 11 that is starting to conduct collector current and reverse-biases the emitter-base diode of the other transistor 10 or 11. The transistor 10 or 11 whose emitter-base diode is thus forward-biased presents a very low input resistance, which draws most of the starting current drained from battery 14, while the other transistor 10 or 11 whose emitter-base diode is reverse-biased presents a high input resistance and therefore draws little current.

Due to unavoidable asymmetry in the disclosed circuit, one or the other of the transistors 10 or 11 spontaneously will start to conduct current. The following is offered as an explanation of the action which takes place in the oscillator under certain operating conditions without, however, intending to limit this invention to this particular theory of operation:

Assuming that transistor 10 begins to conduct first, the change of current at collector 18 produces a voltage across the upper half of the transformer primary 16 which drives the voltage at this collector increasingly more positive than the potential at the negative battery terminal. The voltage across the transformer primary 16 induces in the transformer secondary feedback winding 24 a voltage which drives the base 20 negative with respect to emitter 12, thereby causing the base 20 to draw more current. This is reflected as a further increase in the current at collector 18, which in turn causes a greater voltage across the upper half of the transformer primary 16, so that the voltage at collector 18 approaches the voltage at emitter 12. Accordingly, the voltage drop across the upper half of the transformer primary is substantially equal to the battery voltage. This condition prevails as the current at collector 18 increases.

During this time, the voltage induced in the feedback secondary winding 24 drives the base 21 of the other transistor positive with respect to emitter 19, thereby maintaining transistor 11 substantially non-conducting.

While the current at collector 18 increases cumulatively, as described above, it cannot increase abruptly because of the inductance of the upper half of the primary winding 16 through which it flows. Rather, this collector current increases exponentially in accordance with the L/R time constant of the circuit, L being the inductance of the upper half of primary winding 16, and R being the sum of the effective resistance of the upper half of primary winding 16 and the collector impedance of transistor 10. This collector current increases relatively slowly and exponentially toward a final saturation value, which is determined by the forward bias voltage E/N between the base and emitter of transistor 10, E being the battery voltage and N being the ratio of the number of turns in the upper half of the primary winding 16 to the number of turns in the upper half of the feedback winding 24.

As current saturation is reached at collector 18, the voltage across the upper half of the transformer primary 16 drops to substantially zero because the rate of change of collector current is now substantially zero. When this happens, the induced voltage in the feedback winding 24 also drops to substantially zero, thereby reducing to substantially zero the driving voltage to transistor 10 and removing the reverse bias on the base 21 of transistor 11.

It will be evident that the foregoing operation produces a substantially square wave of voltage across the transformer secondary 25 connected to load 29.

Since the forward bias on transistor 10 has been removed the current at collector 18 decreases. This decrease takes place at a much more rapid rate than the current build-up at collector 18 because now transistor 10 presents a high collector impedance, so that the L/R time constant for this circuit is now much shorter.

The rapid decrease of current at collector 18 induces across the primary winding 16 a high voltage having an instantaneous amplitude measured by $$L\frac{di}{dt}$$

L being the inductance of the primary winding 16 and $$\frac{di}{dt}$$

being the rate of change of current at collector 18. This induced voltage is opposite in sign to that caused by the initial current conduction at collector 18 because $$\frac{di}{dt}$$

has reversed in sign. Accordingly, the collector 19 of transistor 11 is driven positive with respect to the negative battery terminal. In practice, it has been found that this voltage induced by the rapid current decay at collector 18 drives the collector 19 positive with respect to emitter 13, so that briefly the transistor 11 conducts in the reverse direction. However, this condition cannot continue since the rate of increase of current at collector 19 induces a voltage across the lower half of primary winding 16 which opposes that induced by the decay of current at collector 18. After the current at collector 18 has decayed sufficiently the current at collector 19 reverses its direction and begins to operate in the normal direction.

The above-described rapid decay of the current at collector 18 induces in the feedback secondary winding 24 a voltage which forward-biases the emitter-base diode portion of transistor 11, tending to cause this transistor to conduct in the forward direction. Accordingly, the positive current at collector 19 increases in exponential fashion, inducing a driving voltage across the secondary feedback winding 24 which maintains base 21 negative with respect to emitter 13. This maintains transistor 11 conducting. At the same time transistor 10 is reverse biased by this driving voltage and hence is non-conducting.

The potential at collector 19 rapidly approaches the emitter potential, so that the voltage across the lower half of primary winding 16 is substantially equal to the battery voltage as the current at collector 19 continues to increase. Thus, a substantially square wave voltage is applied to the load 29.

When current saturation is reached at collector 19 the voltage across the transformer primary 16 drops to substantially zero, as does the voltage induced in the feedback winding 24. With the removal of this driving voltage the current at collector 19 begins to decrease rapidly, inducing a voltage across the transformer primary which causes transistor 10 to begin to conduct in the same fashion as transistor 11 had begun to conduct, as described.

In this manner the transistors 10 and 11 conduct in alternate sequence at a frequency which is inversely proportional to the inductance of the transformer primary 16 and which also depends upon the peak collector current drawn during conduction by each transistor and the voltage of D.C. source 14. Accordingly, any changes in the number of turns of the transformer primary, core area, core material, feedback turns ratio or voltage of D.C. source 14 affect the frequency of oscillation. In practice, oscillation frequencies within the range from about 130 to 8,000 cycles per second have been obtained.

From Fig. 1 it will be apparent that the network composed of resistor 34 and transistor 35 is connected across battery 14, so that these elements draw current from the battery even if neither push-pull connected transistor 10, 11 is conducting. When the first transistor 10 or 11 begins to conduct, as described above, a substantial portion of the current through resistor 34 is drawn by the emitter-base portion of the conducting transistor 10 or 11.

Thus, the provision of the resistive impedance network composed of resistor 34 and transistor 35 insures additional current to the transistor which is starting to conduct. This enables positive starting of the oscillator, even under full load. Also, the same action takes place when one transistor 10 or 11 cuts off and the other begins to conduct since the self-starting network provides additional current for the transistor 10 or 11 which is just beginning to conduct. Therefore, positive maintenance of oscillations is achieved.

Throughout its conduction cycle the input resistance of each transistor 10 or 11 increases. Accordingly, in the absence of the resistive impedance network composed of resistor 34 and transistor 35 the base current to the conducting transistor 10 or 11 would decrease appreciably as the input resistance of that transistor increased. However, by the provision of this resistive impedance network the base current to the conducting transistor 10 or 11 is made more stable throughout the conduction cycle. Thus, if resistor 34 is relatively high most of the driving current for the conducting transistor 10 or 11 comes from the voltage across the corresponding half of the feedback winding 24 of transformer 17. In one practical embodiment resistor 34 is of the order of 10 ohms or greater. The base current to the conducting transistor 10 or 11 is much less sensitive to changes in the input resistance of this transistor throughout its conducting cycle. This has the effect of changing the distribution of the emitter and collector currents throughout the conduction cycle in such fashion that the power losses in the transistor 10 or 11 are reduced.

In the operation of the Fig. 1 oscillator, transistor 35 functions as a variable resistor, presenting a resistive impedance which varies inversely with the load current. This action of transistor 35 takes place as follows: Since resistor 32 is in series with load 29, a voltage appears across resistor 32 which is proportional to the current drawn by the load. Resistor 32 is small compared to the lowest expected value of load impedance, so that the voltage across resistor 32 is small. This voltage is applied through resistor 44 to the base electrode 42 of transistor 35, causing a base current in transistor 35 which is nearly proportional to the load current, provided the resistor 44 has an ohmic value sufficiently high with respect to the input impedance of transistor 35. When transistor 10 is conducting, its input impedance is low and the voltage across the feedback winding 24 polarizes transistor 35 for transistor action and transistor 35 has a collector current that is nearly equal to $\beta$ times its base current (since the collector load is practically a short circuit). This current at the collector of transistor 35 must flow through the base-emitter diode of transistor 10 in the proper direction for increasing the collector current in transistor 10. At this time the base-emitter diode of transistor 11 is reverse-biased and this transistor draws very little current.

When transistor 10 cuts off and transistor 11 begins to conduct transistor 35 supplies driving current to transistor 11 in the same manner.

At light loads, the load current is small, the voltage across resistor 32 is small, the base current to transistor 35 is small, the driving current from transistor 35 to the oscillating transistors 10 and 11 is small, and the power dissipation in the oscillating transistors is small.

At heavy loads, the load current is higher, the voltage across resistor 32 is greater, the base current to transistor 35 is increased, and the driving current from transistor 35 to the oscillating transistors 10 and 11 is increased in order to maintain oscillations under the heavier load requirements.

Since the collector voltage for transistor 35 is equal to the feedback voltage, which is a fraction of the battery voltage, its power dissipation is small and it need have a power rating which is only a fraction of that of transistors 10 and 11.

Resistor 44 is adjusted for the power output required.

Figures 3, 4:
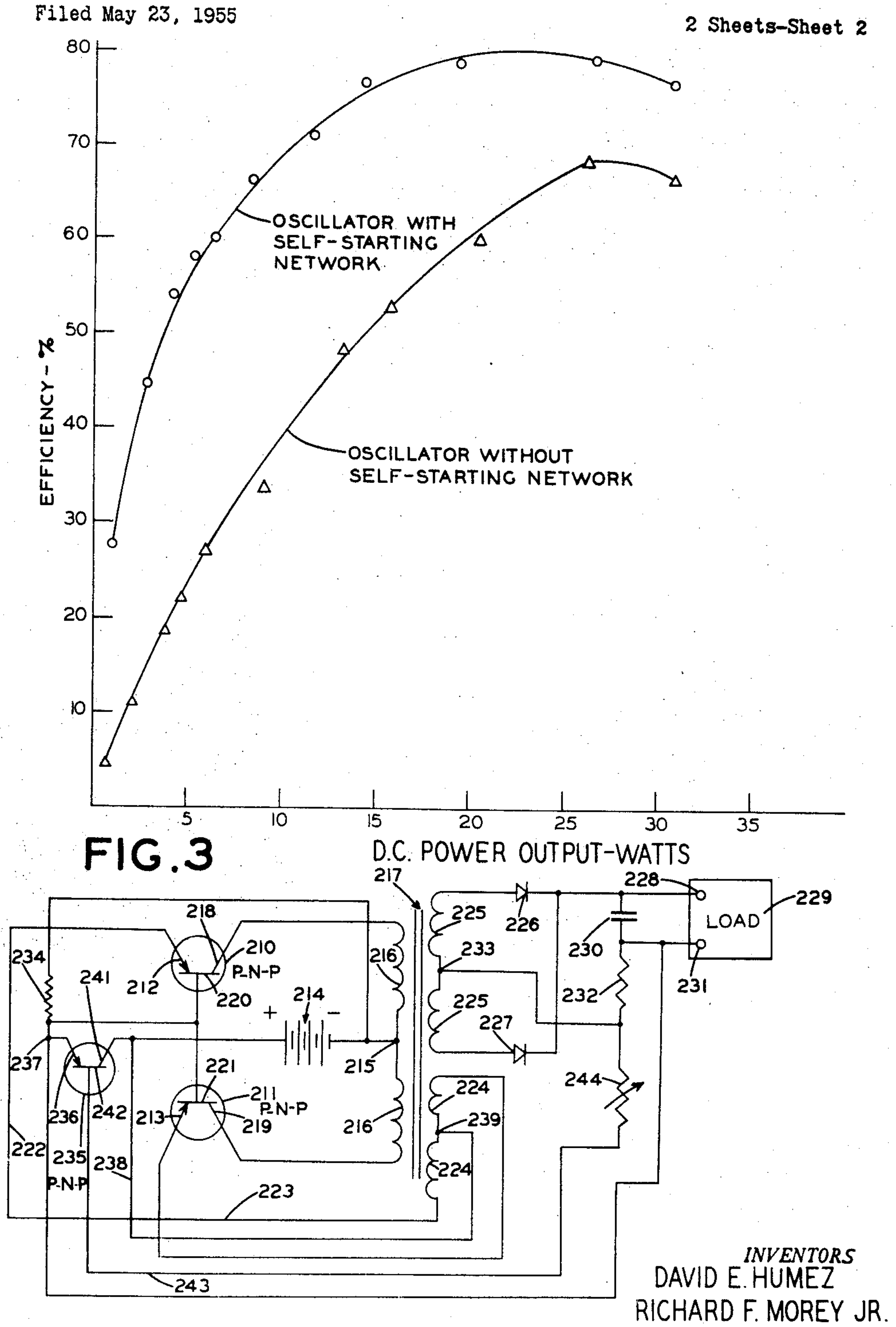
Figure 3 is a graph showing efficiency plotted against power output for the Fig. 1 oscillator circuit and for an oscillator identical to Fig. 1 except that it lacks the self-starting network.
Figure 4 is a circuit diagram of a common-base transistor oscillator embodying the general principles of the present invention.

Figure 3 shows the efficiency vs. power output curve of the Fig. 1 circuit, compared with the same curve for a similar oscillator not having the self-starting feedback network composed of resistor 34 and transistor 35. It will be apparent that the Fig. 1 oscillator operates at much improved efficiency at partial loads and attains approximately maximum efficiency at much lighter loads, maintaining close to peak efficiency over a much wider range of load variations. The maximum power output is about the same in both cases. In actual practice, under certain operating conditions a maximum efficiency of about 89% has been obtained with the Fig. 1 oscillator.

The circuit embodiment of Fig. 1 is adapted for easy compensation for variations in transistor parameters. Thus, if for some reason, such as low alpha or abnormally high input resistance, a pair of transistors connected in push-pull, as illustrated, does not develop sufficient peak collector current to supply the required load power then resistor 30 or resistor 44 can be reduced to provide additional driving current to the base of the conducting transistor. Obviously, this adjustment of a single resistor is an extremely simple arrangement to compensate for unavoidable variations in transistor parameters. In the absence of such an ararngement, the only other possible way to provide compensation would be to change the number of turns on the feedback winding 24 to provide the required driving current. Obviously this would be costly and inconvenient.

The circuit of Fig. 1 is short-circuit safe since a short circuit load stops the oscillator and the power input becomes quite low.

The Fig. 1 oscillator produces a square wave output, which is advantageous from the aspects of efficiency and voltage regulation.

Figure 2:
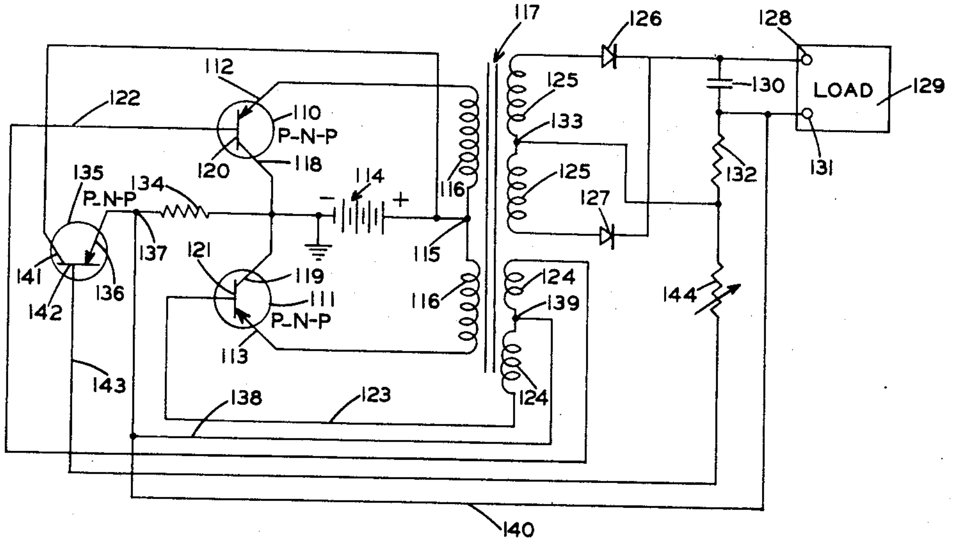
Figure 2 is a circuit diagram of a common-collector transistor oscillator in accordance with this invention.

In Fig. 2 there is illustrated schematically an alternative embodiment of the present invention which is essentially similar to that of Fig. 1 except that in this instance the oscillating transistors operate with the collectors connected in common, rather than the emitters, as in the first embodiment. In Fig. 2 a pair of P-N-P transistors 110 and 111 are connected in push-pull relation with their respective collector electrodes 118 and 119 connected directly to the grounded negative terminal of battery 114. Each collector electrode is grounded to the can in which that transistor is mounted, and preferably the can is grounded to the chassis of the apparatus. Thus, the chassis serves as a heat sink which is highly effective in dissipating the heat caused by power losses in the transistors.

The positive terminal of this battery is connected to the center tap 115 on the primary winding 116 of a transformer 117. The opposite ends of the primary winding are connected to the respective emitter electrodes 112 and 113 of the transistors. The base electrodes 120 and 121 of the transistors are connected by lines 122 and 123, respectively, to opposite ends of the secondary feedback winding 124 on the core of transformer 117. Feedback winding 124 has a suitable number of turns to provide a voltage step-up sufficient to provide driving current for maintaining oscillations. For equivalent operation, if the primary winding has the same number of turns as in Fig. 1 the feedback winding 124 in Fig. 2 has a number of turns equal to the sum of the turns on the primary winding plus the number of turns on the feedback winding 24 in Fig. 1.

Another secondary winding 125 on the core of transformer 117 has its opposite ends connected to rectifiers 126, 127, which have their respective negative terminals connected directly to one terminal 128 of the load 129. A filtering condenser 130 is connected across the load terminals 128 and 131. A resistor 132 is connected between the load terminal 131 and a center tap 133 on the transformer secondary winding 125. Secondary winding 125 has a sufficient number of turns to provide a stepped-up voltage for operating the load.

The self-starting resistive impedance network in Fig. 2 includes a resistor 134 having one of its terminals connected directly to the grounded collector electrodes of transistors 110 and 111. A second resistive impedance element in the form of a P-N-P transistor 135 is connected between the other terminal of resistor 134 and the positive battery terminal. The emitter electrode 136 of transistor 135 is directly connected at point 137 to this other terminal of resistor 134 and this point is directly connected through line 138 to a center tap 139 on the feedback winding 124. Also point 137 is directly connected through line 140 to the load terminal 131. The collector electrode 141 on transistor 135 is connected directly to the positive terminal of battery 114. The base electrode on transistor 135 is connected through line 143 and resistor 144 to the center tap 133 on the transformer secondary 125.

The operation of the Fig. 2 oscillator is essentially similar to that of Fig. 1, which has been described in detail hereinbefore. Accordingly, a detailed description of the operation of Fig. 2 is considered unnecessary.

Figure 4 illustrates a further embodiment of this invention in which two P-N-P transistors 210 and 211 have their respective base electrodes 220 and 221 connected together. The D.C. power supply in the form of a battery 214 has its negative terminal connected directly to a center tap 215 on the primary winding 216 of transformer 217. The opposite ends of this primary winding are connected respectively, as shown, to the collector electrodes 218 and 219 on the transistors 210 and 211. A secondary feedback winding 224 on the core of transformer 217, which provides a voltage step-down, has its opposite ends connected respectively to the emitter electrodes 212 and 213 on transistors 210 and 211. A center tap 239 on this feedback winding is connected directly to the positive terminal of battery 214. The turns ratio between the primary and feedback windings is about the same as in the common-emitter embodiment of Fig. 1 for equivalent operation.

Transformer 217 also is provided with a secondary winding 225 which provides a suitable voltage step-up. The opposite ends of secondary winding 225 are connected to the positive terminals of rectifier diodes 226, 227, which have their negative terminals connected directly to one terminal 228 of the load 229. A charging condenser 230 is connected across the load terminals 228 and 231. A resistor 232 is connected between load terminal 231 and a center tap 233 on the secondary winding 225.

This embodiment of the present invention has a self-starting resistive impedance arrangement comprising a resistor 234 and a third P-N-P transistor 235 connected in series with each other across the battery 214. Resistor 234 has one of its terminals connected directly to the negative terminal of battery 214 and its other terminal connected directly to the emitter 236 of transistor 235. Point 237, at which resistor 234 and emitter 236 are connected, is connected directly to the load terminal 231. Point 237 is also connected directly to both base electrodes 220 and 221 on the transistors 210 and 211, respectively. The collector electrode 241 on transistor 235 is connected directly to the positive battery terminal and through line 238 to a center tap 239 on the feedback winding 224. The base electrode 242 on transistor 235 is connected directly through line 243 and resistor 244 to the center tap 233 on the secondary winding 225.

The operation of this embodiment of the invention is essentially similar to that of Fig. 1 and will not be described in detail. It will be noted that the connections from the ends of the feedback winding 224 to the transistors 210 and 211 are reversed from the Fig. 1 arrangement because the emitter and base connections in these transistors have been reversed from the Fig. 1 arrangement. The feedback connections illustrated in Fig. 3 provide driving current of appropriate sign for maintaining oscillations, as will be apparent to those skilled in the art.

While there have been described herein and illustrated in the accompanying drawings certain preferred embodiments of the present invention, it is to be understood that various modifications, omissions and refinements which depart from the illustrated embodiments may be adopted without departing from the spirit and scope of the present invention. For example, the present oscillator may be embodied in a plug-in unit as disclosed in United States Letters Patent 2,916,704 issued on co-pending application of Richard F. Morey, Serial No. 510,483, assigned to the assignee of the present invention. Such a plug-in unit does not have its own D.C. power supply or power transformer, since the unit is adapted for insertion in a vibrator-type power supply so that it can use the battery and power transformer already present in such power supply. Furthermore, if desired, in each embodiment it is possible to eliminate one of the oscillating transistors, thereby providing a single-ended oscillator of lower power output.

We claim:

1. In combination, a transistor having an input and an output, power supply connections for the transistor, a load coupled to the transistor output, a feedback network coupling the transistor output in energy feedback relation to the transistor input, and, included in said feedback network, variable resistive impedance means of controllable resistivity coupled to the load and means responsive to the power drawn by the load for controlling the resistivity of said impedance means to vary the feedback energy supplied to the transistor input in accordance with the power drawn by the load.

2. A transistor oscillator comprising a transistor, input and output circuits for the transistor, power supply connections for the transistor, a feedback network coupling said output circuit in energy feedback relation to said input circuit, first resistive impedance means connected between one of said power supply terminals and said feedback circuit, and second resistive impedance means connected in said feedback network and having a connection to said other power supply terminal, said second resistive impedance means having a variable resistance characteristic and being connected to present an ohmic resistance in said feedback circuit which varies inversely with the power output from said transistor.

3. In combination, a transistor, input and output circuits for said transistor, power supply connections for the transistor, a load coupled to said output circuit, first and second resistive means connected in series with each other across said power supply connections, and a feedback network coupling said output circuit in energy feedback relation to said input circuit and including said second resistive impedance means, said second resistive impedance means having a variable resistance characteristic and being coupled to the load to have its resistance varied inversely with the power drawn by the load.

4. In combination, a transistor having input and output circuits, power supply connections for the transistor, a load coupled to said output circuit, a feedback network coupling said output circuit in energy feedback relation to said input circuit, first resistive impedance means connected between one of said power supply terminals and said feedback circuit, second resistive impedance means connected in said feedback circuit and having a connection to the other power supply terminal, said second resistive impedance means having a variable resistance characteristic and being coupled to the load to present an ohmic resistance in said feedback circuit which varies inversely with the power to the load.

5. A transistor oscillator comprising a first transistor, power supply connections for said first transistor, input and output circuits for said first transistor, a resistive impedance element and a second transistor connected in series with each other across said power supply connections, a feedback network, including said second transistor, coupling said output circuit back to said input circuit in energy feedback relation, means for converting the output from said first transistor to direct current and coupling a load thereto; and circuit connections to said second transistor to vary the impedance thereof in accordance with load current.

6. A transistor oscillator comprising a first transistor, power supply terminals for said first transistor, input and output circuits for said first transistor, a feedback network coupling said output circuit back to said input circuit in energy feedback relation, resistive impedance means connected between one of said power supply terminals and said feedback circuit, a second transistor connected in said feedback circuit and having a connection to the other power supply terminal, means for converting the output from said first transistor to direct current and coupling a load thereto; and circuit connections to said second transistor to vary the impedance thereof in accordance with load current.

7. A transistor oscillator comprising a first transistor having input and output circuits, power supply connections for said transistor, a resistor and a second transistor connected in series with each other across said power supply connections, a feedback network, including said second transistor, coupling the output circuit back to the input circuit in energy feedback relation, means for converting the output from said first transistor to direct current and coupling a load thereto; and circuit connections to said second transistor to vary the impedance thereof in accordance with load current.

8. In combination, a first transistor, input and output circuits for said first transistor, power supply connections for said first transistor, a load coupled to said output circuit, a resistor and a second transistor connected in series with each other across said power supply connections, a feedback network, including said second transistor, coupling said output circuit in energy feedback relation to said input circuit, and a connection from said second transistor to the load rendering the impedance presented by said second transistor in said feedback circuit variable inversely with the power drawn by the load.

9. In combination, a transistor having input and output circuits, power supply connections for the transistor, a load coupled to said output circuit, a feedback network including transformer means coupling said output circuit in energy feedback relation to said input circuit, and variable resistive impedance means of controllable resistivity in said feedback network coupled to the load and means responsive to the power drawn by the load for controlling the resistivity of said impedance means to vary the feedback energy supplied to said input circuit in accordance with the power drawn by the load.

10. In combination, a first transistor, input and output circuits for said first transistor, power supply connections for said first transistor, a load coupled to said output circuit, resistive impedance means and a second transistor connected in series with each other across said power supply connections, a feedback circuit coupling said output circuit in energy feedback relation to said input circuit and comprising a transformer having a primary winding connected in said output circuit and a secondary winding coupled to said input circuit, said feedback circuit including said second transistor, and a connection from said second transistor to the load rendering the impedance presented by said second transistor in said feedback circuit variable inversely with the power drawn by the load.

11. In combination, a first transistor having input and output circuits, power supply connections for said transistor, a load coupled to said output circuit, a transformer having a primary winding connected in said output circuit, a secondary feedback winding on the transformer inductively coupled to said primary winding and coupled to said input circuit, another transistor comprising a semiconductor, a base electrode making ohmic contact with said semiconductor, and emitter and collector electrodes each making rectifier contact with said semiconductor, resistive impedance means connected between one of said power supply connections and one of said rectifier contact electrodes on said other transistor, the other rectifier contact electrode on said other transistor being connected directly to the other of said power supply terminals, said one rectifier contact electrode on said other transistor having a connection to said feedback winding, and a connection from the base electrode on said other transistor to the load.

12. In combination, a pair of transistors connected in push-pull relation and each having an input and an output, a pair of power supply terminals for said transistors, a load coupled to the transistor outputs, a transformer having a primary winding connected across the outputs of said transistors, a center tap on said primary winding connected directly to one of said power supply terminals, a secondary feedback winding on the transformer inductively coupled to said primary winding and connected at its opposite ends to the inputs of said transistors, a resistive impedance element and another transistor connected in series with each other across said power supply connections, a connection from the juncture of said resistive impedance element and said other transistor to a center tap on said feedback winding, and a connection from said other transistor to the load which renders the impedance of said other transistor variable inversely with the power drawn by the load.

13. In combination, a pair of transistors connected in push-pull relation and each including a semiconductor, a base electrode in ohmic contact with the semiconductor, and an emitter electrode and a collector electrode each making rectifying contact with the semiconductor, a pair of power supply terminals for said transistors, a transformer having a primary winding connected at its opposite ends to corresponding rectifying contact electrodes on the respective transistors, a connection from a center tap on said primary winding to one of said power supply terminals, a secondary feedback winding on the transformer inductively coupled to said primary winding and connected at its opposite end to corresponding other electrodes on the respective transistors, a load coupled to said primary winding, a third transistor comprising a semiconductor, a base electrode making ohmic contact therewith, and an emitter and a collector electrode each making rectifier contact with said last-mentioned semiconductor, a resistor connected between one of said power supply terminals and one of said rectifier contact electrodes on said third transistor, the other rectifier contact electrode on said third transistor being connected directly to the other of said power supply terminals, said one rectifier contact electrode on said third transistor being connected directly to a center tap on said feedback winding, and a connection from the base electrode on said third transistor to the load.

References Cited in the file of this patent

UNITED STATES PATENTS

| | | |
|---|---|---|
| 2,318,061 | Dailey | May 4, 1943 |
| 2,757,243 | Thomas | July 31, 1956 |
| 2,784,367 | Van De Polder | Mar. 5, 1957 |
| 2,791,739 | Light | May 7, 1957 |
| 2,798,160 | Bruck et al. | July 2, 1957 |

OTHER REFERENCES

Article, "Point contact and Junction-Transistors," by Doresmus, pages 18 and 19 of Radio Electronic Engineering for April 1952.

Article, "Junction Transistor Equivalent Circuits and Vacuum Tube Analogy," by Giacoletto, pages 1490–1493 of P.I.R.E. vol. 40, No. 11 for November 1952.